United States Patent
Yuan

(10) Patent No.: US 12,512,852 B2
(45) Date of Patent: Dec. 30, 2025

(54) NOISE-SHAPING CONVERTER WITH DIGITAL MODULATOR

(71) Applicant: Silicon Laboratories Inc., Austin, TX (US)

(72) Inventor: Gang Yuan, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 232 days.

(21) Appl. No.: 18/454,111

(22) Filed: Aug. 23, 2023

(65) Prior Publication Data

US 2025/0080134 A1  Mar. 6, 2025

(51) Int. Cl.
H03M 3/00 (2006.01)
H03M 1/12 (2006.01)
H03M 1/46 (2006.01)

(52) U.S. Cl.
CPC ........... H03M 3/424 (2013.01); H03M 1/125 (2013.01); H03M 1/462 (2013.01); *H03M 1/12* (2013.01); *H03M 1/46* (2013.01)

(58) Field of Classification Search
CPC ...... H03M 3/424; H03M 1/125; H03M 1/462; H03M 1/12; H03M 1/46
See application file for complete search history.

(56) References Cited

U.S. PATENT DOCUMENTS

| | | | |
|---|---|---|---|
| 5,565,868 A | 10/1996 | Azrouf et al. | |
| 5,736,950 A | 4/1998 | Harris et al. | |
| 8,749,417 B2 | 6/2014 | Coban et al. | |
| 9,246,509 B1 | 1/2016 | Bhargava et al. | |
| 9,537,497 B2 | 1/2017 | Ho et al. | |
| 10,715,156 B1 | 7/2020 | Coban | |
| 10,931,300 B1 | 2/2021 | Coban et al. | |
| 2007/0241950 A1 | 10/2007 | Petilli et al. | |
| 2008/0272945 A1 | 11/2008 | Melanson | |
| 2009/0243572 A1* | 10/2009 | Mills | H02M 3/155 323/282 |

(Continued)

FOREIGN PATENT DOCUMENTS

EP    0399738    11/1990

OTHER PUBLICATIONS

Jeffrey Fredenburg; 27.6 A 90MS/s 11MHz Bandwidth 62dB SNDR Noise-Shaping SAR ADC; 2012 IEEE International Solid-State Circuits Conference; pp. 468-470.

(Continued)

*Primary Examiner* — Joseph J Lauture
(74) *Attorney, Agent, or Firm* — Trop, Pruner & Hu, P.C.

(57) ABSTRACT

In one aspect, an apparatus includes: a first feedback digital-to-analog converter (DAC) to receive a first feedback signal from a first successive approximation register (SAR) and output a first analog signal; a comparator to compare the first analog signal with a reference voltage; the first SAR to store a digital value based on the comparison and provide the first feedback signal to the first DAC; a second feedback DAC to receive a modulated quantized residual error based on the comparison and output a second analog signal; a second SAR to store a quantized residual error; and a delta-sigma modulator (DSM) to modulate the quantized residual error and provide the modulated quantized residual error to the second feedback DAC.

20 Claims, 7 Drawing Sheets

(56) References Cited

U.S. PATENT DOCUMENTS

2015/0069985 A1 3/2015 Wilson
2022/0141586 A1 5/2022 Shajaan et al.

OTHER PUBLICATIONS

Bonnie Baker, "How delta-sigma ADC's work, Part 1," Texas Instruments Incorporated, Analog Applications Journal, 3Q 2011, (6 Pages).
Douglas G. Marsh, et al; "A Single-Chip CMOS PCM Codec, with Filters," IEEE Journal of Solid-State Circuits, vol. SC-16, No. 4, Aug. 1981, pp. 308-315.
U.S. Appl. No. 17/701,742, filed Mar. 23, 2022, entitled "Analog-to-Digital Converter Having Punctured Quantizer," by John M. Khoury et al.

* cited by examiner

NOISE-SHAPING CONVERTER WITH DIGITAL MODULATOR

BACKGROUND

Analog-to-digital converters (ADCs) are present in a variety of integrated circuits, and are used to convert an analog signal, typically in the form of a voltage, into a digital value. One type of ADC is a successive approximation register (SAR) ADC, which successively compares an incoming analog signal to a series of reference voltages to resolve the analog signal into a digital value of a given resolution.

A noise-shaping SAR ADC can enhance a traditional SAR ADC's resolution by performing an oversampling operation. In such ADC, the quantization error is saved and processed in a certain way, and the result is sent to the following data conversion phases. By doing so, a delta-sigma modulation could be performed, and the quantization noise is reshaped to a higher frequency, which can be filtered out in later data processing. The delta-sigma operation is implemented with active circuits like an operational amplifier (op-amp) or a passive switched-capacitor circuit for the modulation. Both of these arrangements suffer from adverse consequences. The active approach can consume high current and take more area, and the passive approach can compromise the delta-sigma modulation performance and results.

SUMMARY OF THE INVENTION

In one aspect, an apparatus includes: a first feedback digital-to-analog converter (DAC) to receive a first feedback signal from a first SAR and output a first analog signal; a comparator coupled to the first feedback DAC, the comparator to compare the first analog signal with a reference voltage; the first SAR coupled to the comparator, the first SAR to store a digital value based on the comparison and provide the first feedback signal to the first DAC; a second feedback DAC to receive a modulated quantized residual error based on the comparison and output a second analog signal; a second SAR coupled to the comparator, the second SAR to store a quantized residual error; and a delta-sigma modulator (DSM) coupled to the second SAR, the DSM to modulate the quantized residual error and provide the modulated quantized residual error to the second feedback DAC.

In one implementation, the second feedback DAC is to operate successively to the first feedback DAC. The DSM may be configured as a digital DSM. The digital DSM may include: a first gain element to modulate the quantized residual error with a first coefficient; and a first delay element coupled to the first gain element, the first delay element to delay the modulated quantized residual error. The digital DSM may further include: a second delay element to delay the quantized residual error; a second gain element coupled to the second delay element to modulate the delayed quantized residual error; and a first summer to sum the modulated quantized residual error and the delayed modulated quantized residual error to output a first sum signal.

In one implementation, the apparatus comprises a noise-shaping SAR ADC. The first feedback DAC may be configured to sample an input analog signal during a sampling phase, and the first SAR, during a conversion phase, is to resolve the input analog signal to the digital value during a conversion phase. The DSM, during a noise-shaping phase, is to modulate the quantized residual error. The second feedback DAC, during a next sampling phase, is configured to subtract the modulated quantized residual error from the first analog signal.

In other implementations, the DSM may be an analog DSM or a hybrid analog and digital DSM.

In one implementation, the apparatus further comprises a third feedback DAC to receive a third feedback signal from a third SAR and output a third analog signal, the third feedback DAC to operate successively to the first feedback DAC and prior to the second feedback DAC. The second feedback DAC may be unmatched to the first feedback DAC, the first feedback DAC having a greater resolution than the second feedback DAC.

In another aspect, a method comprises: converting, during a first cycle of a conversion operation, an input voltage to a digital value; converting, during the first cycle of the conversion operation, a residual error of converting the input voltage to the digital value to a quantized error; digitally modulating the quantized error to a digitally modulated quantized error; and removing, during a second cycle of the conversion operation, the residual error using the digitally modulated quantized error.

In one implementation, converting, during the first cycle of the conversion operation, the input voltage to the digital value comprises: sampling, in a first DAC, the input voltage during a sampling phase of the first cycle; and converting, using a first SAR, the input voltage to a digital value during a conversion phase of the first cycle.

In one implementation, converting, during the first cycle of the conversion operation, the residual error to the quantized error comprises: sampling, in a second DAC, the residual error during a noise-shaping phase of the first cycle; and converting, using a second SAR, the residual error to the quantized error during the noise-shaping phase of the first cycle.

In an implementation, digitally modulating the quantized error to the digitally modulated quantized error comprises: providing the quantized error to a digital DSM; and in the DSM: modulating the quantized error with a first coefficient; delaying the quantized error in at least one delay element and modulating the delayed quantized error with a second coefficient; combining the modulated quantized error with the delayed modulated quantized error to form a sum value; delaying the sum value in at least one other delay element; and providing the delayed sum value to the second DAC as the modulated quantized error.

In yet another aspect, an apparatus comprises: at least one sensor to sense real world information and provide an analog signal based at least in part thereon; and an ADC coupled to the at least one sensor to convert the analog signal to a digital value. The ADC may include: an analog domain to receive and convert the analog signal to the digital value based at least in part thereon; and a digital domain coupled to the analog domain, the digital domain to receive a quantization error associated with the conversion of the analog signal, modulate the quantization error, and provide the modulated quantization error to the analog domain.

In an implementation, the analog domain comprises: a first feedback DAC to receive a first feedback signal from a first SAR and output a first analog feedback signal; a comparator coupled to the first feedback DAC, the comparator to compare the first analog feedback signal with a reference voltage; the first SAR coupled to the comparator, the first SAR to store a digital value based on the comparison and provide the first analog feedback signal to the first DAC; a second feedback DAC to receive the modulated quantization error and output a second analog feedback signal; and a second SAR coupled to the comparator, the second SAR to store the quantization error.

In one implementation, the analog domain is to subtract the second analog feedback signal from the first analog feedback signal prior to the comparison of the first analog feedback signal with the reference voltage.

DETAILED DESCRIPTION

In various embodiments, a noise-shaping SAR ADC is provided with an analog domain and a digital domain. The analog domain may include multiple digital-to-analog converters (DACs), including a secondary DAC that is used to process a quantization error of a primary DAC. This quantization error, when digitized, can be provided to the digital domain, where it is modulated. The modulated quantization error is then returned to the analog domain, and more specifically to the secondary DAC.

With embodiments, minimal extra circuity in addition to conventional SAR ADC circuitry is used to perform this noise-shaping feature. Embodiments may realize this noise-shaping feature with reduced current consumption and silicon area as compared to a conventional noise-shaping SAR ADC. Embodiments of a noise-shaping ADC having a digital DSM may incur low current consumption, because no DC-current circuit like an op-amp is introduced. In addition, the design may be implemented in a compact area, reducing chip real estate. This is so, as the secondary DAC that is used to digitize the quantization error from the primary DAC may be configured to be of a smaller size. Further, the secondary DAC may be wholly unmatched to the primary DAC as the circuit is insensitive to mismatch between the DACs, easing design constraints.

Depending on implementation, the digitized quantization error from the secondary DAC is modulated in the digital domain, by a digital delta-sigma modulator (DSM) (which may be implemented as a first-order, second-order, or even higher-order DSM). The modulation result is applied to the secondary DAC in a following cycle's sampling phase, such that this following cycle's conversion operation converts a combined value of a new sampled signal and the modulated error from the previous cycle. Therefore a noise-shaping operation is performed.

Figures 1A, 1B:
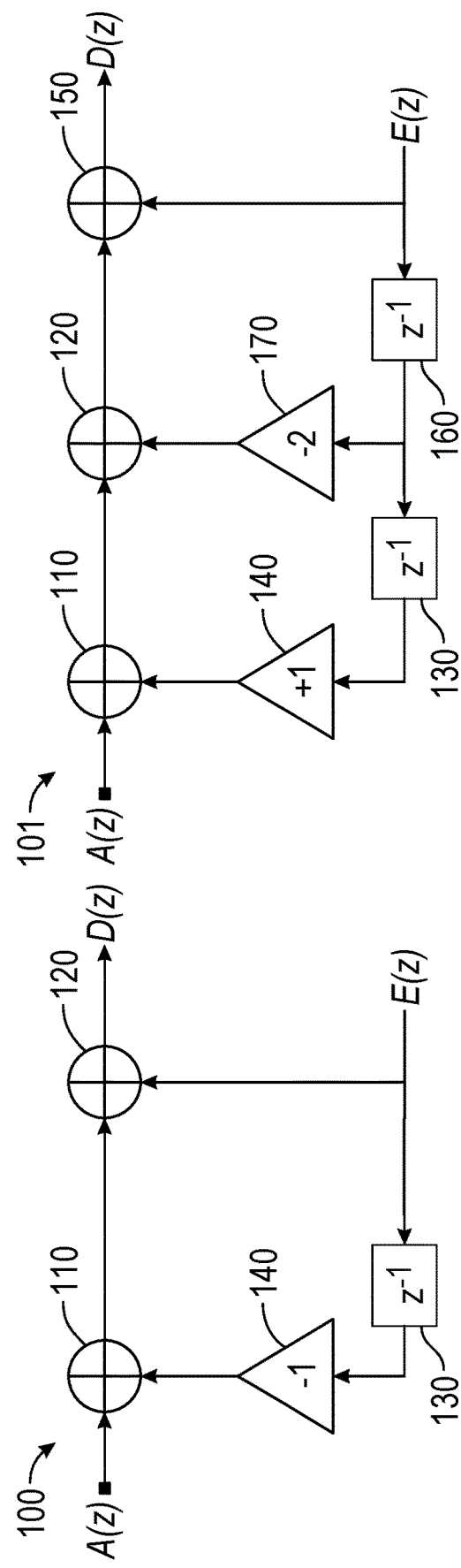
FIG. 1A is a block diagram of a noise-shaping ADC in accordance with an embodiment.
FIG. 1B is a block diagram of a noise-shaping ADC in accordance with another embodiment.

Referring now to FIG. 1A, shown is a block diagram of a noise-shaping ADC in accordance with an embodiment. In the high-level view shown in FIG. 1A, ADC 100 is illustrated in a systematic diagram describing operation of the ADC to shape the quantization error. Understand that this generic form can be implemented in different types of ADC configurations in which the delta-sigma modulation can be done in the digital domain, the analog domain, or a hybrid of a digital and analog configuration.

As illustrated, ADC 100 includes a signal path to receive an input analog signal A(z) in a first summer 110. Summer 110 is configured to sum this input analog signal with a filtered feedback signal representing a modulated version of the quantization error, resulting in a first sum signal. The output of summer 110 is provided to a second summer 120, which is configured to sum the first sum signal with the unmodulated quantization error signal E(z). The resulting output of second summer 120, a second sum signal, is thus the digitized signal D(z).

Still referring to FIG. 1A, the error signal, in addition to being provided directly to second summer 120, also is filtered through a delay element 130 and an amplifier 140 (which as shown in FIG. 1A may be an inverse unit amplifier). As discussed above, the error signal E(z) is a modulated signal that may be modulated digitally and/or in the analog domain.

With the arrangement in FIG. 1A, this error signal is subtracted from a following cycle of the input analog signal to realize a noise-shaping effect. In implementations in which a digital modulation is performed, the error is quantized into the digital domain and arithmetic operations may be performed to obtain the modulated error signal that is provided back to the analog domain for subtraction via first summer 110 and second summer 120. In an analog domain and/or hybrid approach, the quantized error signal can be modulated using a capacitor arrangement.

Note that FIG. 1A illustrates a first-order arrangement with a single delay element 130. Operation of ADC 100 may be according to:

$$D(z) = A(z) + E(z)(1 - z^{-1}) \qquad \text{[EQ. 1]}$$

in the frequency domain, and in the time domain according to:

$$D(n) = A(n) + E(n) - E(n-1). \qquad \text{[EQ. 2]}$$

In other cases, a second-order implementation may be used. Referring now to FIG. 1B, shown is a block diagram of a noise-shaping ADC in accordance with another embodiment. In the high-level view shown in FIG. 1B, ADC 101 is illustrated with the same systematic diagram of FIG. 1A, and uses the same numbering convention, and thus common components are not discussed further. In the arrangement of FIG. 1B, note the presence of an additional summer 150, along with an additional delay element 160 and another amplifier 170. In this arrangement, amplifier 140 is configured as a unitary amplifier, while amplifier 170 is configured as a negative 2× amplifier. With the arrangement in FIG. 1B, operation of ADC 101 in the frequency domain may be according to:

$$D(z) = A(z) + E(z)(1 - z^{-1})^2, \qquad \text{[EQ. 3]}$$

and in the time domain according to:

$$D(n) = A(n) + E(n) - 2E(n-1) + E(n-2). \quad [\text{EQ. 4}]$$

Figure 2:
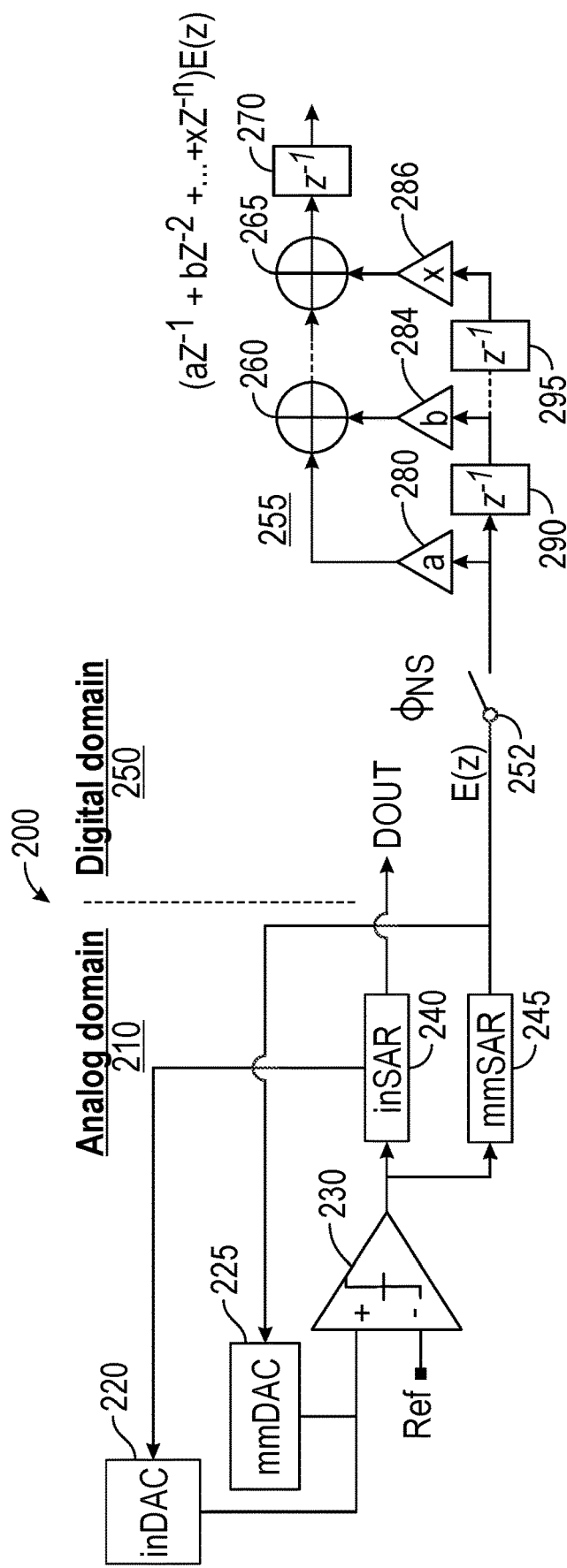
FIG. 2 is block diagram of a noise-shaping ADC in accordance with another embodiment.

Referring now to FIG. 2, shown is a block diagram of a noise-shaping SAR ADC having a digital delta-sigma modulator in accordance with an embodiment. As shown in FIG. 2, ADC 200 is illustrated with an analog domain 210 and a digital domain 250. In analog domain 210, multiple feedback DACs are present, including a first DAC 220 and a second DAC 225. First DAC 220 is a main path or signal DAC, also referred to herein as a so-called "inch DAC" (inDAC). Although embodiments are not limited in this regard, in one example inDAC 220 may be implemented as a ten-bit capacitor DAC (CDAC). Second DAC 225 is implemented as a residue DAC, also referred to herein as a "millimeter DAC" (mmDAC). In this example mmDAC 225 may be implemented as a six-bit CDAC.

In the high-level view of FIG. 2, DACs 220, 225 may also operate as samplers to sample the incoming analog signal; of course in other implementations, separate sampling circuits may be present. Also although not shown in the high-level view of FIG. 2, understand that DACs 220, 225 may be implemented with capacitor arrays having a set of capacitors. Depending upon implementation, different weightings for the individual capacitors of DACs 220, 225 may be used. For example, one or both of DACs 220, 225 may be implemented using binary-weighted, radix-weighted or thermometer-weighted capacitor arrays, among others.

Understand that the terms "inDAC" and "mmDAC" are used to indicate that these separate DACs do not need to be intentionally matched and may be of different capacitor weightings, just as English and metric units are not matched. Residue DAC 225 is configured to digitize the quantization error remaining after conversion of the incoming analog signal using first DAC 220. As such, second DAC 225 operates successively to first DAC 220.

More particularly, after a sampling phase in which the input analog signal is sampled (in a separate sampler or within first DAC 220), first DAC 220 performs a conversion phase in which an input analog signal is converted into a digital value according to a SAR operation. This SAR operation results in the input analog signal being converted into a digital code having a given number of bits (e.g., 10 bits). After all bits are resolved in the SAR operation within first DAC 220, a residual error between the input analog signal and the digital result is quantized using second DAC 225 (which may be implemented as a 6-bit DAC). As with first DAC 220, second DAC 225 is configured to perform a SAR operation, which here is performed successively after resolution of the digital value in first DAC 220.

Still referring to FIG. 2, to perform the SAR operation, DACs 220, 225 couple to a comparator 230 (and specifically to a positive input terminal of comparator 230). In turn, a reference voltage is provided to a negative input terminal of comparator 230. The resulting comparator decisions are provided to the corresponding SARs, namely, inSAR 240 for the signal path and mmSAR 245 for the residual path. At the completion of a conversion phase, inSAR 240 holds the digital value corresponding to the input analog signal, which it outputs as the digital output (DOUT). In turn, mmSAR 245 outputs the digitized error signal E(z). As shown, both SARs 240, 245 couple in feedback to corresponding DACs 220, 225.

Still referring to FIG. 2, the quantized residual error is output from analog domain 210 to digital domain 250, via a switch 252. Although illustrated as a switch, in some embodiments a latch instead may be configured to provide the quantized residual error to digital domain 250 at initiation of a noise-shaping phase ($\phi_{NS}$).

As seen, digital domain 250 includes a digital DSM 255. In the high-level view shown in FIG. 2, digital DSM 255 includes multiple summers 260, 265. As shown, summer 260 is coupled to receive the quantized error signal E(z) (as amplified by a first amplifier 280) and a delayed version of the quantized error signal (which passes through a first delay element 290 and through another amplifier 284). The sum signal output from summer 260 is provided to a first input of summer 265, where it is summed with a further delayed version of the quantized error signal (through another delay element 295 and another amplifier 286). In turn, the resulting sum output from summer 265 may be provided back to mmDAC 225 via another delay element 270. More specifically, this delayed error signal may be applied to mmDAC 225 in a next sampling phase. In one example, first amplifier 280 may have a negative unity gain, second amplifier 284 may have a 3× gain, and third amplifier 286 may have a −3× gain. Alternatively, delay element 270 could also be placed right after switch 252 and before first delay element 290 and amplifier 280. Mathematically the resulting filtered error signal expression detailed in Eq. 5 below will not be changed.

With the configuration shown in FIG. 2, the resulting filtered error signal that is provided back to mmDAC 225 may be according to Equation 5, below:

$$(aZ^{-1} + bZ^{-2} + \ldots + xZ^{-n})E(z). \quad [\text{EQ. 5}]$$

Although FIG. 2 shows an example of an $n^{th}$-order configuration of a digital DSM, embodiments are not limited in this regard and any desired configuration, including first-order or second-order digital DSMs may be used. In an example, a first-order DSM may include a single gain element (e.g., a negative unity amplifier) having an output coupled to a first delay element. In an example, a second-order DSM may include an additional gain element (with one gain element set as a −2× amplifier, and the second gain element set as a unity gain amplifier), another delay element coupled to the input of the unity gain amplifier, and a summer to sum the outputs of the two gain elements.

Using an embodiment as in FIG. 2, the quantization error at the output of ADC 200 is shaped to high frequency. The resulting high-frequency noise can be filtered out by a decimation filter (not shown for ease of illustration in FIG. 2). Note that when this filtered error signal is applied to mmDAC 225, mmDAC 225 converts the digital value back to an analog signal, where it is subtracted from the output of inDAC 220 during the next sampling phase to complete the subtraction operation (as discussed above with regard to FIG. 1).

Although shown at this high level in the embodiment of FIG. 2, many variations and alternatives are possible. For example, more than two feedback DACs may be present in other embodiments. As one example, the signal DAC may be split into 2 separate DACs, e.g., each having a 6-bit resolution (with corresponding SARs). These signal DACs may be matched with respect to each other, while the residue DAC may remain unmatched.

Figure 3:
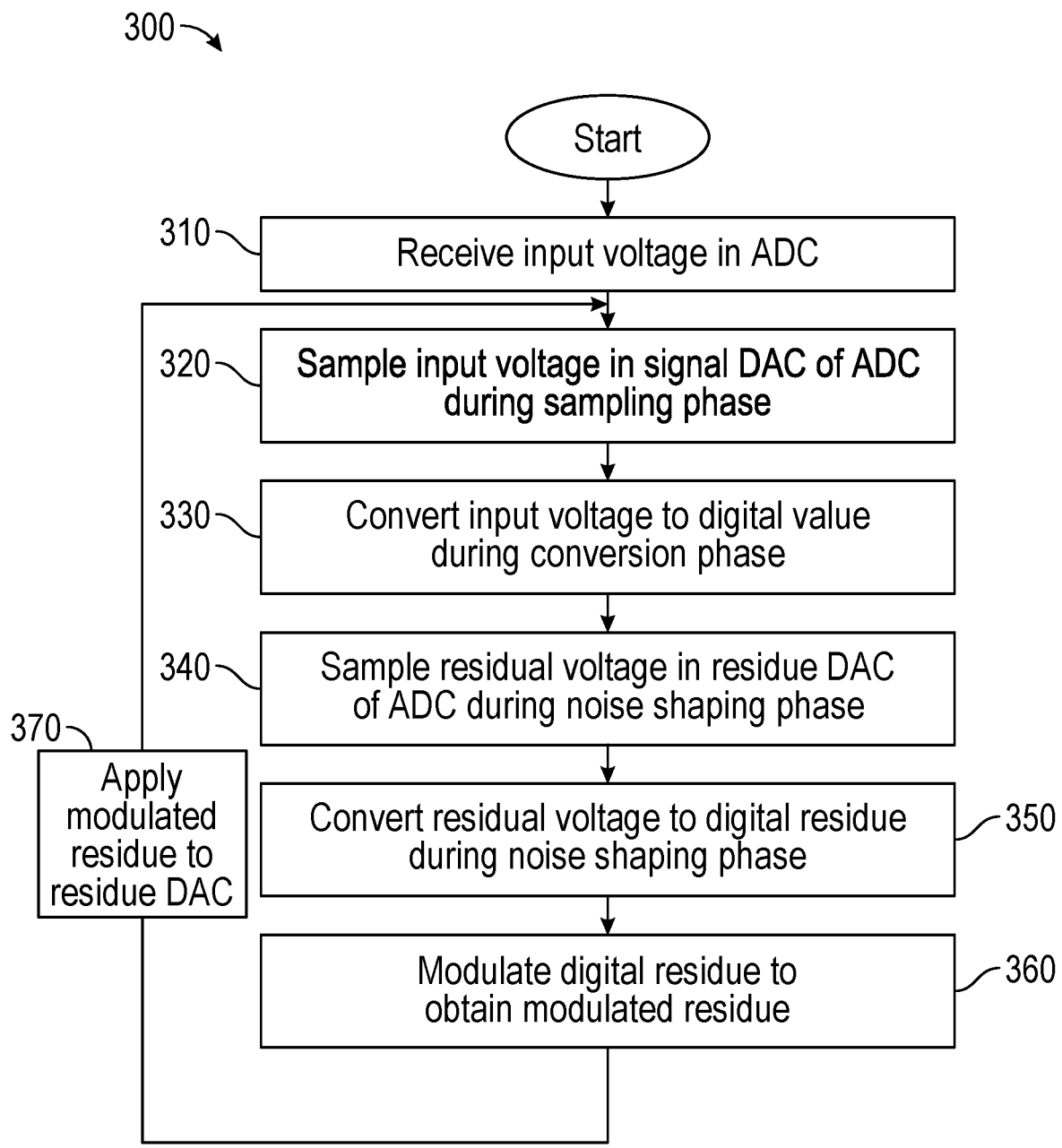
FIG. 3 is a flow diagram of a method in accordance with an embodiment.

Referring now to FIG. 3, shown is a flow diagram of a method in accordance with an embodiment. More specifically, FIG. 3 describes a method 300 for operating a noise-shaping SAR ADC having a digital DSM. As such, method 300 may be performed within an ADC such as shown in FIG. 2. In some cases, method 300 can be performed by this hardware circuitry alone, while in other cases the circuitry may be configured at least in part by firmware and/or software, particularly where a configurable ADC is provided that enables different resolutions, filter orders and so forth. A controller of a device including the ADC may configure the ADC, e.g., depending upon application, desired resolution or so forth.

In any event, method 300 begins by receiving an input voltage in the ADC (block 310). Understand that this input voltage may be any type of sensed analog signal (e.g., given real-world information), such as the output of a thermal sensor, pressure sensor or so forth. In an embodiment, this input voltage may be received within a sampler circuit of the ADC (in implementations in which there are separate samplers and DACs). Otherwise, the input signal is coupled to charge capacitors of a signal DAC.

Still referring to FIG. 3, next the input voltage may be sampled in this signal DAC during a sampling phase (block 320). To this end, the signal DAC may store the input voltage in a capacitor array of the signal DAC. Next at block 330, the input voltage is converted to a digital value during a conversion phase. In an embodiment, a SAR operation is performed to resolve each bit of the signal DAC to obtain this digital value using the signal DAC and a first SAR.

Understand that after this operation, there still may remain a residual error between the analog input voltage and the digital value. Thus at block 340, this residual error value as a residual voltage is sampled in a residue DAC of the ADC during a noise-shaping phase. As above, a capacitor array of the residue DAC may perform this sampling. Thereafter at block 350, the residual voltage is converted to a digital residue (corresponding to a quantized residual error) during the noise-shaping phase, using the residue DAC and another SAR.

Still referring to FIG. 3, this resulting digital residue is provided to the digital domain where, at block 360, the digital residue is modulated in an $n^{th}$-order digital DSM to obtain a modulated residue (modulated quantized residual error). This resulting modulated residue is applied to the residue DAC (block 370). In turn, the residue DAC converts this digital residue to an analog residue signal. This analog residue value is subtracted from the input signal during a next cycle (e.g., as both of these signals are provided to the same input of a comparator of the ADC, as shown above in FIG. 2). Thus with embodiments, the quantization error is shaped to high frequency. As this high frequency may be outside the bandwidth of the resulting signal (e.g., by way of a decimation filter), the resulting digital value is noise shaped.

Figure 4:
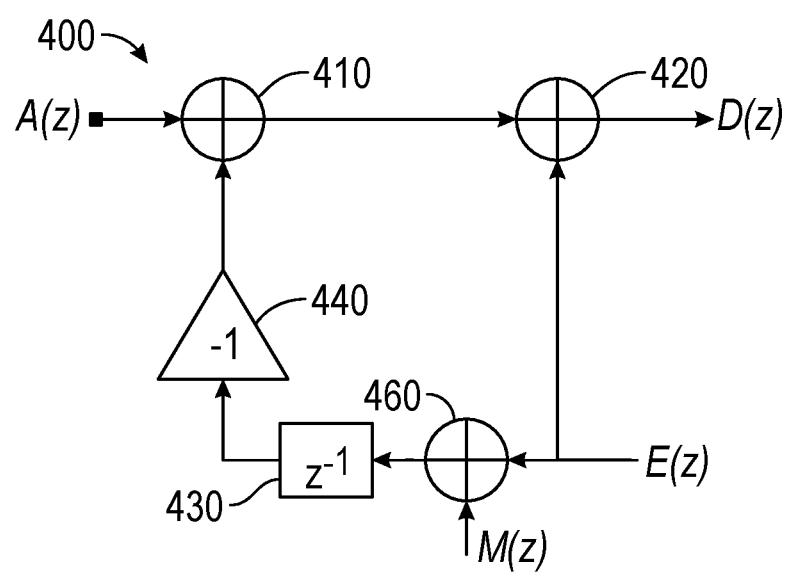
FIG. 4 is a block diagram of a noise-shaping ADC in accordance with another embodiment.

Referring now to FIG. 4, shown is a block diagram of a noise-shaping ADC in accordance with yet another embodiment. In the high-level view shown in FIG. 4, ADC 400 is illustrated in a systematic diagram describing operation of the ADC and illustrating a remaining quantization noise. In FIG. 4, ADC 400 is illustrated as a first-order implementation according to:

$$D(z) = A(z) + E(z)(1 - z^{-1}) - M(z)z^{-1}, \qquad \text{[Eq. 6]}$$

where M(z) is the mmDAC quantization error, which is not noise-shaped but is averaged by a given oversampling ratio (OSR). In FIG. 4, ADC 400 is illustrated in the same systematic diagram from FIG. 1A, and uses the same numbering convention (albeit of the "400" series), and thus common components are not discussed further. In ADC 400, an additional summer 460 is configured to combine the mmDAC quantization error (M(z)) with the quantized residual error (E(z)), and provide the summed value to delay element 430. The mmDAC quantization error (M(z)) sets the limit to the quantization noise shaping effectiveness at low frequency. But as long as it is over dominated by other noise sources, like thermal noise, kT/C noise, etc., it will be negligible in practice.

Table 1 below illustrates a MATLAB model of a digital third-order DSM example. This example assumes a SAR ADC implementation having a 12-bit inDAC and a 6-bit mmDAC, where the mmDAC is non-linear with respect to the inDAC.

For example, if mmDAC_mismatch==1.1, and the inDAC least significant bit (LSB) is 2 fF, the mmDAC most significant bit (MSB) used in quantization is 2 fF/2*1.1=1.1 fF. For a third-order modulation, 2 more bits of 2.2 fF, and 4.4 fF can be added in the feedback phase. Note that in the example of Table 1 below, the quantization error is digitized by the 6-bit mmDAC.

TABLE 1

```
% Quantize all the input
for i = 1 :length(Vin)
   if i==1
      Vcmp(i)=Vin(i);
   elseif i==2
      Vcmp(i)=Vin(i)−3*Verr(i−1); % 3rd-order noise shaping
   elseif i==3
      Vcmp(i)=Vin(i)−3*Verr(i−1)+3*Verr(i−2); % 3rd-order noise shaping
   Else
      Vcmp(i)=Vin(i)−3*Verr(i−1)+3*Verr(i−2)−Verr(i−3); % 3rd-order noise
      shaping
   End
   Dout(i)=round (Vcmp(i)/2*2^bit)*2/2^bit;
   Verr(i)=Dout(i)−Vcmp(i);
   Verr(i)=round(Verr(i)/2*2^(bit+6)*mmDAC_mis)*2/2^(bit+6)/mmDAC_mis;
   %mmDAC_mis from inDAC
End
```

Figure 5:
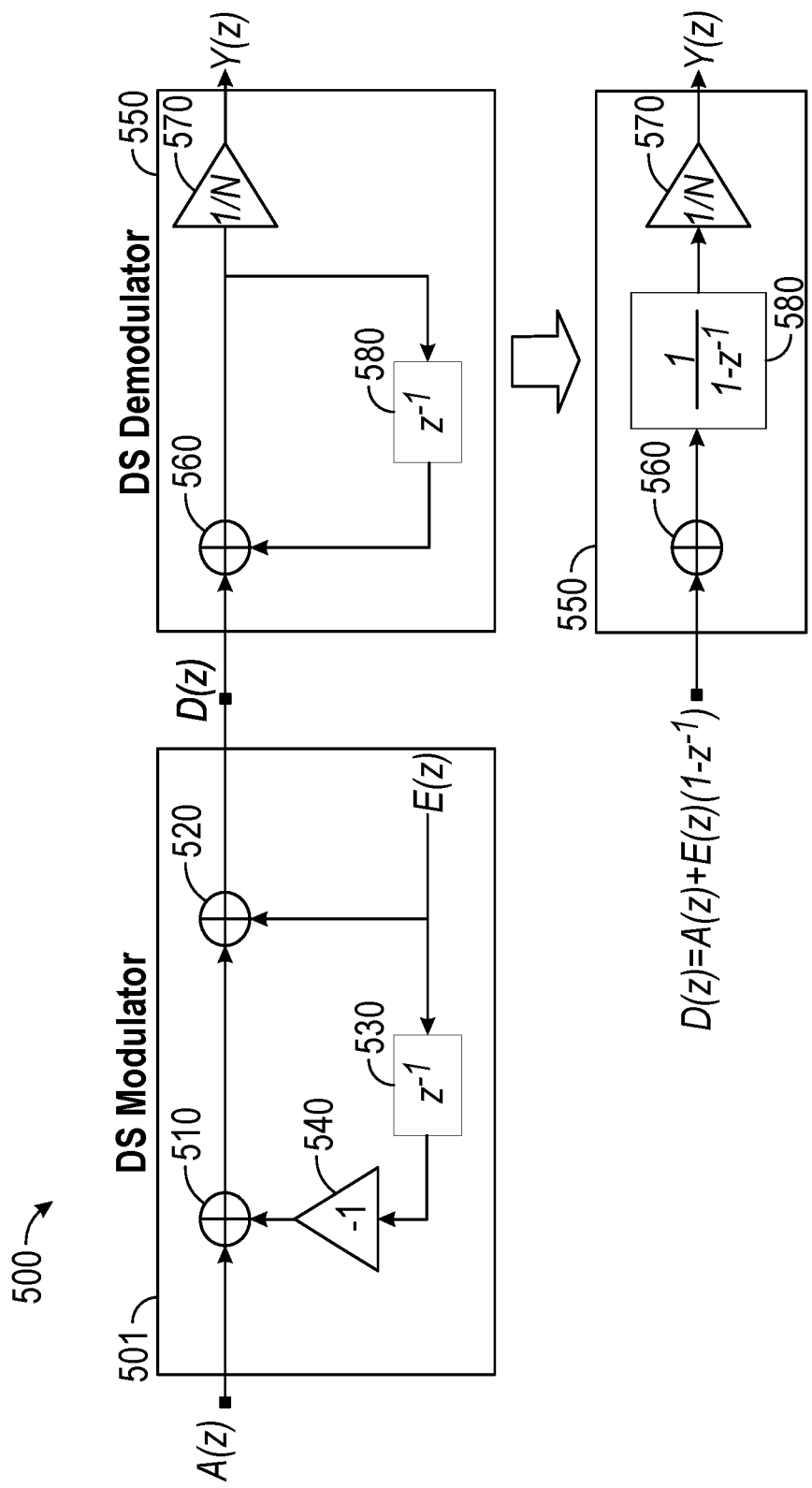
FIG. 5 is a block diagram of a noise-shaping ADC in accordance with another embodiment.

Embodiments may be configured to provide a selective OSR. Referring now to FIG. 5, shown is a block diagram of a noise-shaping ADC having an output coupled to a delta-sigma demodulator in accordance with an embodiment. In FIG. 5, ADC 500 is illustrated with a first-order DSM 501 as in FIG. 1A (and thus the same numbering convention, albeit of the "500" series is used). The digital output D(z) is provided to a delta-sigma demodulator 550 having a summer 560, a gain element 570 and a delay element 580 coupled in feedback to summer 560. According to a system level, delta-sigma demodulator 550 can also be drawn in an alternative version as in the bottom part of FIG. 5.

Table 2 below illustrates a first-order example of the incremental operation of ADC 500. Note that in this example with a noise-shaping SAR ADC implemented with a digital modulator, the quantization error is digitized, which enables a determination of where to stop the noise shaping. With a sufficient OSR, the noise floor is determined by the mmDAC quantization noise, instead of the inDAC quantization noise. And while there may be remaining quantization noise due to the mmDAC, as long as it is lower than the circuit thermal noise, it has no impact on performance. Following Table 3, which shows a selective OSR in incremental operation.

TABLE 2

$1^{ST}$-order example $D(0) = A(0) + E(0)$
$D(1) = A(1) + E(1) - E(0)$
$D(2) = A(2) + E(2) - E(1)$
...
$D(N - 1) = A(N - 1) + E(N - 1) - E(N - 2)$ If: $Y = \frac{1}{N}\sum_{0}^{N-1} D(n) \rightarrow Y = \frac{1}{N}\sum_{0}^{N-1} A(n) + \frac{1}{N}E(N-1) \leftarrow$ Random noise $E$ is suppressed by the ratio of OSR.

TABLE 3

Selective OSR in incremental operation

1st-order example $Y(N - 4) = \frac{1}{N-4}\sum_{0}^{N-4} A(n) + \frac{1}{N-4}E(N-5)$ $Y(N - 3) = \frac{1}{N-3}\sum_{0}^{N-3} A(n) + \frac{1}{N-3}E(N-4)$ $Y(N - 2) = \frac{1}{N-2}\sum_{0}^{N-2} A(n) + \frac{1}{N-2}E(N-3)$ $Y(N - 1) = \frac{1}{N-1}\sum_{0}^{N-1} A(n) + \frac{1}{N-1}E(N-2)$ If the OSR is selected when E is the least of the last 4 conversions, statistically there is a 0.5× smaller quantization error in amplitude. If N>>1, that means a 6 dB lower quantization error is gained.

Figure 6:
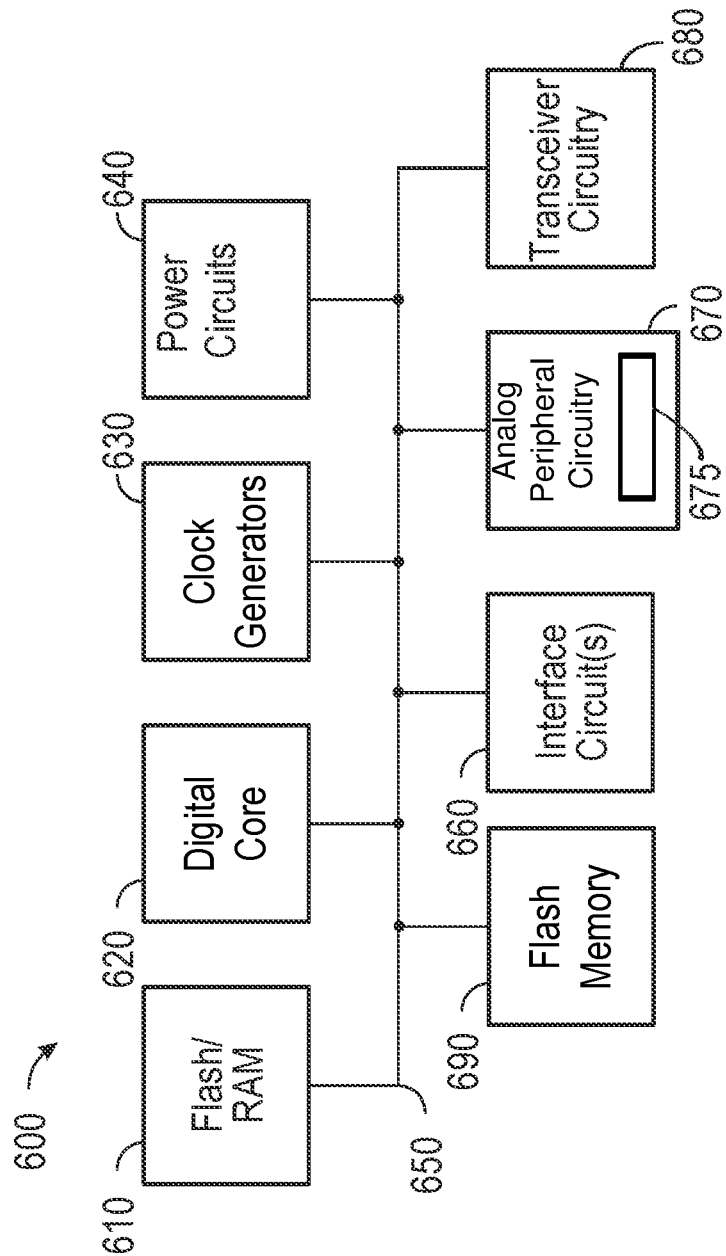
FIG. 6 is a block diagram of a representative integrated circuit that includes ADC circuitry in accordance with an embodiment.

Referring now to FIG. 6, shown is a block diagram of a representative integrated circuit 600 that includes ADC circuitry as described herein. In the embodiment shown in FIG. 6, integrated circuit 600 may be, e.g., a dual mode wireless transceiver that may operate according to one or more wireless protocols (e.g., WLAN and Bluetooth, among others) or other device that can be used in a variety of use cases. In one or more embodiments, the circuitry of integrated circuit 600 shown in FIG. 6 may be implemented on a single semiconductor die.

Integrated circuit 600 may be included in a range of devices including a variety of stations, including smartphones, wearables, smart home devices, other consumer devices, or industrial, scientific, and medical (ISM) devices, among others.

In the embodiment shown, integrated circuit 600 includes a memory system 610 which in an embodiment may include volatile storage, such as RAM and non-volatile memory as a flash memory. As further shown integrated circuit 600 also may include a separate flash memory 690 (or other non-volatile memory), optionally. Flash memory 690 may be implemented as a non-transitory storage medium that can store instructions and data.

Memory system 610 couples via a bus 650 to a digital core 620, which may include one or more cores and/or microcontrollers that act as a main processing unit of the integrated circuit. In turn, digital core 620 may couple to clock generators 630 which may provide one or more phase locked loops or other clock generator circuitry to generate various clocks for use by circuitry of the IC.

As further illustrated, IC 600 further includes power circuitry 640, which may include one or more voltage regulators. Additional circuitry may optionally be present depending on particular implementation to provide various functionality and interaction with external devices. Such circuitry may include interface circuitry 660 which may provide a LAN or other interface with various off-chip devices, and analog peripheral circuitry 670 which may provide a variety of analog functionality, such as analog-to-digital, digital-to-analog, or other purely analog functions (e.g., comparators, oscillators, filters, etc.), and may include one or more noise-shaping SAR ADCs in accordance with embodiments herein.

In addition as shown in FIG. 6, transceiver circuitry 680 may be provided to enable transmission and receipt of wireless signals, e.g., according to one or more of a local area or wide area wireless communication scheme, such as Zigbee, Bluetooth, IEEE 802.11, IEEE 802.15.4, cellular communication or so forth. Understand while shown with this high level view, many variations and alternatives are possible.

Figure 7:
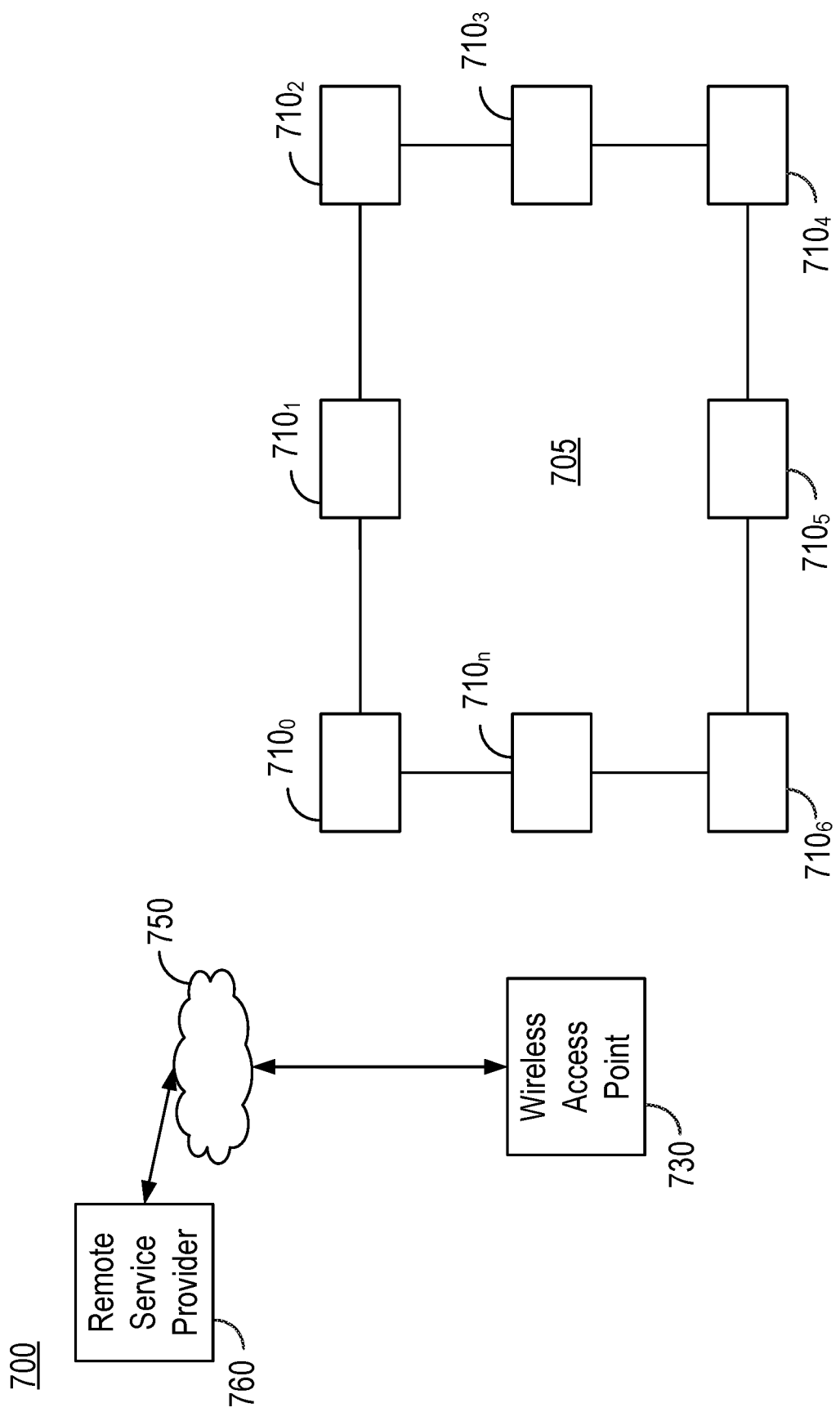
FIG. 7 is a high level diagram of a network in accordance with an embodiment.

ICs such as described herein may be implemented in a variety of different devices such as wireless stations, IoT devices or so forth. Referring now to FIG. 7, shown is a high level diagram of a network in accordance with an embodiment. As shown in FIG. 7, a network 700 includes a variety of devices, including wireless stations including smart devices such as IoT devices, access points and remote service providers, which may leverage embodiments of a noise-shaping SAR ADC.

In the embodiment of FIG. 7, a wireless network 705 is present, e.g., in a building having multiple wireless devices 710$_{0-n}$. As shown, wireless devices 710 couple to an access point 730 that in turn communicates with a remote service provider 760 via a wide area network 750, e.g., the internet. Understand while shown at this high level in the embodiment of FIG. 7, many variations and alternatives are possible.

While the present disclosure has been described with respect to a limited number of implementations, those skilled in the art, having the benefit of this disclosure, will appreciate numerous modifications and variations therefrom. It is intended that the appended claims cover all such modifications and variations.

What is claimed is:

1. An apparatus comprising:
   a first feedback digital-to-analog converter (DAC) to receive a first feedback signal from a first successive approximation register (SAR) and output a first analog signal;
   a comparator coupled to the first feedback DAC, the comparator to compare the first analog signal with a reference voltage;
   the first SAR coupled to the comparator, the first SAR to store a digital value based on the comparison and provide the first feedback signal to the first feedback DAC;
   a second feedback DAC to receive a modulated quantized residual error based on the comparison and output a second analog signal;
   a second SAR coupled to the comparator, the second SAR to store a quantized residual error; and
   a delta-sigma modulator (DSM) coupled to the second SAR, the DSM to modulate the quantized residual error and provide the modulated quantized residual error to the second feedback DAC.

2. The apparatus of claim 1, wherein the second feedback DAC is to operate successively to the first feedback DAC.

3. The apparatus of claim 1, wherein the DSM comprises a digital DSM.

4. The apparatus of claim 3, wherein the digital DSM comprises:
   a first gain element to modulate the quantized residual error with a first coefficient; and
   a first delay element coupled to the first gain element, the first delay element to delay the modulated quantized residual error.

5. The apparatus of claim 4, wherein the digital DSM further comprises:
   a second delay element to delay the quantized residual error;
   a second gain element coupled to the second delay element to modulate the delayed quantized residual error; and
   a first summer to sum the modulated quantized residual error and the delayed modulated quantized residual error to output a first sum signal.

6. The apparatus of claim 1, wherein the apparatus comprises a noise-shaping SAR analog-to-digital converter (ADC).

7. The apparatus of claim 1, wherein the first feedback DAC is to sample an input analog signal during a sampling phase, and the first SAR, during a conversion phase, is to resolve the input analog signal to the digital value during a conversion phase.

8. The apparatus of claim 7, wherein the DSM, during a noise-shaping phase, is to modulate the quantized residual error.

9. The apparatus of claim 8, wherein the second feedback DAC, during a next sampling phase, is configured to subtract the modulated quantized residual error from the first analog signal.

10. The apparatus of claim 1, wherein the DSM comprises an analog DSM.

11. The apparatus of claim 1, wherein the DSM comprises a hybrid analog and digital DSM.

12. The apparatus of claim 1, further comprising a third feedback DAC to receive a third feedback signal from a third SAR and output a third analog signal, the third feedback DAC to operate successively to the first feedback DAC and prior to the second feedback DAC.

13. The apparatus of claim 1, wherein the second feedback DAC is unmatched to the first feedback DAC, the first feedback DAC having a greater resolution than the second feedback DAC.

14. A method comprising:
   converting, during a first cycle of a conversion operation, an input voltage to a digital value;
   converting, during the first cycle of the conversion operation, a residual error of converting the input voltage to the digital value to a quantized error;
   digitally modulating the quantized error to a digitally modulated quantized error; and
   removing, during a second cycle of the conversion operation, the residual error using the digitally modulated quantized error.

15. The method of claim 14, wherein converting, during the first cycle of the conversion operation, the input voltage to the digital value comprises:
   sampling, in a first digital-to-analog converter (DAC), the input voltage during a sampling phase of the first cycle; and
   converting, using a first successive approximation register (SAR), the input voltage to a digital value during a conversion phase of the first cycle.

16. The method of claim 15, wherein converting, during the first cycle of the conversion operation, the residual error to the quantized error comprises:
   sampling, in a second DAC, the residual error during a noise-shaping phase of the first cycle; and
   converting, using a second SAR, the residual error to the quantized error during the noise-shaping phase of the first cycle.

17. The method of claim 15, wherein digitally modulating the quantized error to the digitally modulated quantized error comprises:
   providing the quantized error to a digital delta-sigma modulator (DSM); and
   in the DSM:
      modulating the quantized error with a first coefficient;
      delaying the quantized error in at least one delay element and modulating the delayed quantized error with a second coefficient;
      combining the modulated quantized error with the delayed modulated quantized error to form a sum value;
      delaying the sum value in at least one other delay element; and
      providing the delayed sum value to the second DAC as the modulated quantized error.

18. An apparatus comprising:
   at least one sensor to sense real world information and provide an analog signal based at least in part thereon; and
   an analog-to-digital converter (ADC) coupled to the at least one senor to convert the analog signal to a digital value, the ADC comprising:
      an analog domain to receive and convert the analog signal to the digital value; and
      a digital domain coupled to the analog domain, the digital domain to receive a quantization error associated with the conversion of the analog signal, modulate the quantization error, and provide the modulated quantization error to the analog domain.

19. The apparatus of claim 18, wherein the analog domain comprises:
- a first feedback digital-to-analog converter (DAC) to receive a first feedback signal from a first successive approximation register (SAR) and output a first analog feedback signal;
- a comparator coupled to the first feedback DAC, the comparator to compare the first analog feedback signal with a reference voltage;
- the first SAR coupled to the comparator, the first SAR to store the digital value based on the comparison and provide the first analog feedback signal to the first feedback DAC;
- a second feedback DAC to receive the modulated quantization error and output a second analog feedback signal; and
- a second SAR coupled to the comparator, the second SAR to store the quantization error.

20. The apparatus of claim 19, wherein the analog domain is to subtract the second analog feedback signal from the first analog feedback signal prior to the comparison of the first analog feedback signal with the reference voltage.

* * * * *